United States Patent [19]

Welland et al.

[11] Patent Number: 4,804,863

[45] Date of Patent: Feb. 14, 1989

[54] METHOD AND CIRCUITRY FOR GENERATING REFERENCE VOLTAGES

[75] Inventors: David R. Welland; Donald A. Kerth, both of Austin, Tex.

[73] Assignee: Crystal Semiconductor Corporation, Austin, Tex.

[21] Appl. No.: 929,711

[22] Filed: Nov. 12, 1986

[51] Int. Cl.[4] ............... H03K 4/02; H03K 5/159; H03K 5/00

[52] U.S. Cl. ................... 307/227; 307/352; 307/353; 307/261; 328/127; 328/128; 328/151; 328/186

[58] Field of Search ............ 307/227, 261, 352, 353, 307/262; 328/151, 127, 128, 186, 34, 35, 36; 340/347 AD

[56] References Cited

U.S. PATENT DOCUMENTS

| 4,361,771 | 11/1982 | Reinke | 307/497 |
| 4,439,693 | 3/1984 | Lucas et al. | 307/353 |
| 4,498,063 | 2/1985 | Makabe et al. | 328/151 |

FOREIGN PATENT DOCUMENTS

| 0165417 | 9/1983 | Japan | 307/227 |
| 0181315 | 10/1983 | Japan | 307/227 |

OTHER PUBLICATIONS

Bosshart, "A Multiplexed Switched Capacitor Filter Bank," IEEE Journal of Solid-State Circuits, vol. SC-15, No. 6, Dec. 1980, pp. 939-945.

Ghausi, et al., *Modern Filter Design*, Prentice-Hall, Inc., Englewood Cliffs, NH 07632, 1981, pp. 376-387, 454-474 and 496-501.

Tsukada et al., "CMOS 8b 25MHz Flash ADC," Proceedings of 1985 IEEE International Solid-State Circuits Conference, pp. 34 and 35.

Allstot et al., "An Electrically-Programmable Switched Capacitor Filter," IEEE Journal of Solid-State Circuits, vol. SC-14, No. 6, Dec. 1979, pp. 1034-1041.

*Primary Examiner*—Stanley D. Miller
*Assistant Examiner*—Trong Quang Phan
*Attorney, Agent, or Firm*—Leonard & Lott

[57] ABSTRACT

Method and circuitry for generating precise reference voltages. The method includes generation of a stair-step voltage waveform wherein the voltage changes from step to step are virtually identical. The stair-step voltage waveform generation includes charging a first capacitor to an available voltage reference and then transferring the charge to a larger second capacitor. This charging and subsequent charge transferring is repetitively performed to generate the stair-step waveform across the terminals of the larger capacitor. Sample-and-hold circuits are used to sample the steps of the stair-step voltage waveform and thereby provide a set of DC reference voltages. The circuitry is suitable for fabrication in a CMOS monolithic integrated circuit and can be used in conjunction with flash A/D converters.

7 Claims, 4 Drawing Sheets

FIG. 4

METHOD AND CIRCUITRY FOR GENERATING REFERENCE VOLTAGES

TECHNICAL FIELD

The present invention generally relates to electronic systems and, more particularly, is concerned with a method and circuitry for generating a set of precise reference voltages for use in electronic systems.

BACKGROUND OF THE INVENTION

It is frequently desirable in electronic systems to have a set of precise reference voltages available. One such electronic system is the flash A/D converter. In a conventional flash A/D converter, $2^n$ precise reference voltages typically are needed for comparison to an unknown analog input voltage, where n is the number of digital bits of the converter. Conventional circuitry for generating the needed reference voltages comprises $2^n+1$ resistors connected in series between two available reference voltages (one of which reference voltages may be ground). The series string of resistors divides the difference in the two available reference voltages into $2^n$ additional reference voltages. In a 6-bit A/D flash converter, for example, 65 resistors may be connected in series between ground and an available +3.0 V reference voltage to provide 64 additional reference voltages between ground and +3.0 V. For accuracy of the A/D conversion process it is important that the incremental differences in these additional reference voltages be as precise as possible.

To satisfy cost, size, and reliability objectives, where feasible, it is generally advantageous to fabricate electronic circuits such as the flash A/D converter with monolithic integrated circuit processing technology. With present monolithic integrated circuit fabrication technology, though, it is impractical to fabricate a string of resistors wherein the resistance ratios are sufficiently accurate to provide a flash A/D converter having a resolution of more than 9 bits.

In accordance with the foregoing, a need exists for a method and circuitry for generating a set of highly accurate DC reference voltages for use in electronic systems, and especially for use in the implementation of flash A/D converters in monolithic integrated circuits.

SUMMARY OF THE INVENTION

The present invention provides a method and circuitry for generating a set of highly accurate DC reference voltages for use in electronic systems.

The method and circuitry are particularly suitable for use in a flash A/D converter implemented in a CMOS monolithic integrated circuit. In such an application, the invention can be used in place of a long string of series-connected resistors which is conventionally used for generating the numerous reference voltages required by the converter circuit. And, advantageously, the voltages generated by the method and circuitry of the present invention are typically more accurate than those generated by a conventional resistor string, allowing greater resolution flash A/D converters to be fabricated in monolithic integrated circuits.

In accordance with one aspect of the invention, circuitry for generating a set of DC reference voltages includes switching means for charging a first capacitor to an available reference voltage and then discharging the capacitor into the virtual ground node at the inverting input of a differential amplifier. The differential amplifier has a relatively large feedback capacitor connected from its output to its inverting input. A switch is also connected from the output of the differential amplifier to the inverting input of the differential amplifier. Repetitive charging and discharging of the first capacitor results in the generation of a stair-step voltage waveform at the output of the differential amplifier. The increase in voltage from step to step is virtually identical for all steps. When the stair-step waveform has completed a desired number of steps, the switch which is connected from the output of the differential amplifier to the inverting input of the differential amplifier is momentarily closed to reset the output voltage of the differential amplifier to its lowest voltage, and the next cycle of stair-step waveform generation is commenced. The inputs of a plurality of unity-gain sample-and-hold circuits are connected to the output of the differential amplifier. Each of the sample-and-hold circuits receives a different sampling clock signal from control and timing circuitry for sampling the different voltage steps of the stair-step voltage waveform. Accordingly, the outputs of the sample-and-hold circuits provide a set of precise DC reference voltages.

In accordance with another aspect of the invention, the stair-step voltage waveform may be utilized in electronic systems for purposes other than generating a set of uniformly-spaced DC reference voltages. For such other purposes, the aforementioned sample-and-hold circuits may not be required.

The aforementioned and other features, characteristics, advantages, and the invention in general, will be better understood from the following detailed description of an illustrative embodiment when taken in conjunction with the accompanying drawings.

DETAILED DESCRIPTION OF A PREFERRED EMBODIMENT

Figure 1:
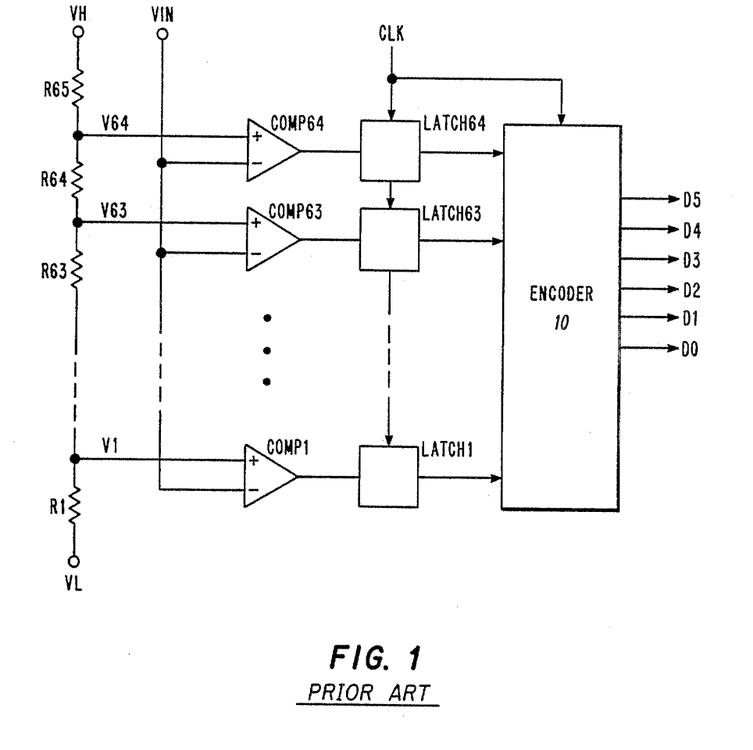
FIG. 1 is an electrical schematic diagram illustrating a flash A/D converter of the prior art.

Referring now to FIG. 1, a six-bit flash A/D converter of the prior art is illustrated. Sixty-five resistors, R1 through R65, are connected in series between a reference voltage VH and a reference voltage VL. The resistors R2 through R64 are designed to each have the same value of resistance, and the resistors R1 and R65 are each designed to have a resistance of one-half that of the other resistors.

For unipolar operation, the VL terminal is connected to ground and the VH terminal is connected to a +3.0 V reference voltage. (For bipolar operation, the VL terminal may be connected to a -1.5 V reference voltage while the VH terminal is connected to a +1.5 V reference voltage.) For the unipolar case, the resistor connection nodes, designated as V1 through V64, provide a set of reference voltages that range in value from slightly above 0 V to slightly below VH. Each of the reference voltage nodes V1 through V64 is connected to the noninverting input of one of a set of 64 voltage comparators, COMP1 through COMP64. An input terminal VIN which receives an unknown analog input voltage is connected to the inverting input of each of the voltage comparators COMP1 through COMP64. Thus, the unknown analog input voltage is simultaneously compared to the reference voltages generated at the nodes V1 through 64. Each of the outputs of the voltage comparators COMP1 through COMP64 is connected to a corresponding clocked latch, LATCH 1 through LATCH 64. The outputs of the latches LATCH 1 through LATCH 64 provide a 64-bit digital representation of the unknown analog voltage applied to the input terminal VIN. This 64-bit digital representation is received by a clocked encoder 10 which encodes the digital representation into a 6 bit binary code on outputs D0 through D5.

In accordance with the foregoing, the circuit of FIG. 1 converts an unknown analog input voltage to a 6 bit binary code for every clock cycle. Accuracy of the conversion is dependent upon the accuracy of the reference voltages generated on the nodes V1 through V64. Increasing the resolution of the flash A/D converter to 8 bits requires the generation of 256 accurate reference voltages, and increasing the resolution to 10 bits would require the generation of 1024 accurate reference voltages.

Figure 2:
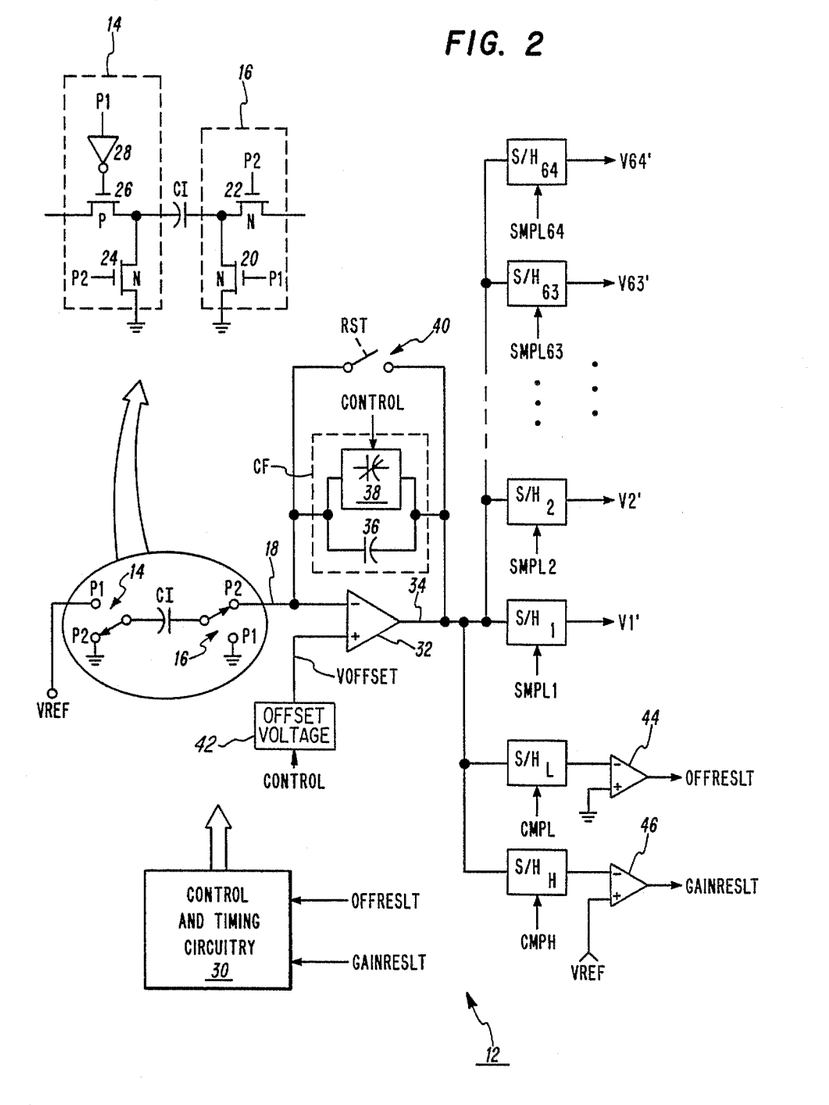
FIG. 2 is an electrical schematic diagram of circuitry for generating reference voltages in accordance with the present invention.

Referring now to FIG. 2, circuitry in accordance with the present invention for generating accurate reference voltages is illustrated. The reference voltages circuitry of FIG. 2 is indicated generally by the numeral 12.

A first capacitor CI has one terminal connected to the common terminal of a two-pole switch 14. The other terminal of the first capacitor CI is connected to the common terminal of a two-pole switch 16. In the preferred embodiment, the first capacitor CI is designed to have a nominal capacitance of 0.5 pF; other values, though, may be used.

One pole of the switch 14 is connected to a first reference voltage VREF, and the other pole of the switch 14 is connected to a second reference voltage which is shown in FIG. 2 as ground.

It should be understood that the ground connections of FIG. 2 can be replaced by connection to other reference voltages, such as to a reference voltage of −1.5 V. For the illustrated embodiment, in which the second reference voltage is defined as ground, a typical value for VREF is +3.0 volts.

One pole of the switch 16 is connected to a node 18, and the other pole of the switch 16 is connected to ground. The switches 14 and 16 operate in response to a pair of non-overlapping clock signals P1 and P2, which are provided by control and timing circuitry 30, and are arranged such that the first capacitor CI is charged to VREF when the clock signal P1 is high ("high" meaning a logic 1 of typically +5.0 V). Alternatively, when the clock signal P1 is low (a logic 0 of close to −5.0 V) and the clock signal P2 is high, the first capacitor CI is connected between ground and the node 18.

A conventional implementation of the switches 14 and 16 which is suitable for fabrication in a CMOS monolithic integrated circuit is illustrated in FIG. 2. The implementation of the switch 16 comprises N-channel transistors 20 and 22, and the implementation of the switch 14 comprises an enhancement-mode N-channel transistor 24, an enhancement-mode P-channel transistor 26, and a CMOS inverter 28. Each of the other switches included in the reference voltage circuitry 12 may similarly be conveniently fabricated in a CMOS integrated circuit.

The inverting input of a differential amplifier 32, is connected to the node 18, and the output of the differential amplifier 32 is connected to a node 34.

A second capacitor CF is connected between the nodes 34 and 18. The second capacitor CF comprises a capacitor 36 connected in parallel with a variable capacitive element 38. In the illustrative embodiment, the capacitor 36 is designed to have a nominal capacitance of approximately 31 pF, and the variable capacitive element 38 is designed to be variable up to a maximum of approximately 2 pF; therefore, the second capacitor CF is adjustable from approximately 31 pF to 33 pF.

Also connected between the nodes 34 and 18 is a switch 40 which becomes low impedance in response to a logic 1 of a reset signal RST. The reset signal RST is provided by the control and timing circuitry 30.

Offset voltage circuitry 42 provides an output that is coupled to a node designated as VOFFSET. An embodiment of the offset voltage circuitry 42 is described hereinbelow in conjunction with FIG. 4. The offset voltage circuitry 42, which is controlled by the control and timing circuitry 30, provides an adjustable bias voltage to the noninverting input of the differential amplifier 32.

In the preferred embodiment, the nose 34 is coupled to each of the inputs of 64 conventional unity-gain sample-and-hold circuits, designated herein as $S/H_1$ through $S/H_{64}$. Associated with the sample-and-hold circuits $S/H_1$ through $S/H_{64}$ are signals SMPL1 through SMPL64, each of which causes its corresponding sample-and-hold circuit to sample the voltage of the node 34. The signals SMPL1 through SMPL63 are generated by the control and timing circuitry 30. Each of the sample-and-hold circuits $S/H_1$ through $S/H_{64}$ provides a corresponding output; these outputs are designated herein as V1' through V64'.

Another two conventional unity-gain sample-and-hold circuits, designated as $S/H_L$ and $S/H_H$, likewise have their inputs coupled to the node 34. The sample-and-hold circuits $S/H_L$ and $S/H_H$ receive sampling signals CMPL and CMPH, respectively, from the control and timing circuitry 30. The output of the sample-and-hold circuit $S/H_L$ is coupled to the inverting input of a voltage comparator 44, the noninverting input of which is connected to ground. The output of the voltage comparator 44 provides a signal OFFRESLT which is coupled as an input to the control and timing circuitry 30.

The output of the sample-and-hold circuit $S/H_H$ is connected to the inverting input of a voltage comparator 46, the noninverting input of which is connected to the first reference voltage VREF. The output of the voltage comparator 46 provides a signal GAINRESLT which is likewise coupled as an input to the control and timing circuitry 30.

Figure 3:
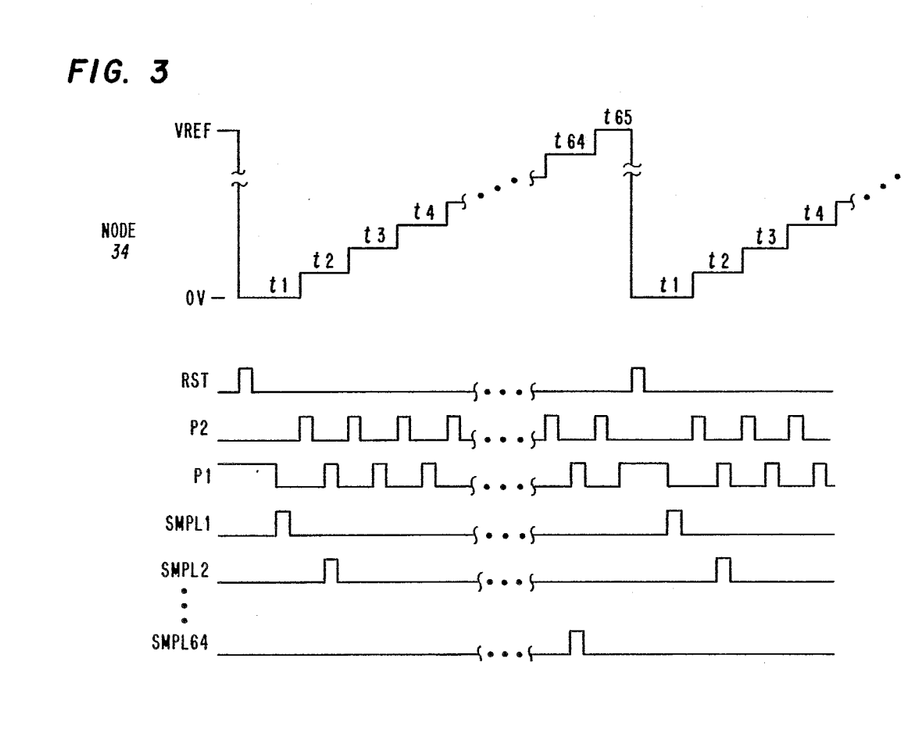
FIG. 3 is a timing diagram corresponding to operation of the reference voltage circuitry of FIG. 2.

Operations of the reference voltage circuitry 12 is next described in conjunction with the timing diagram of FIG. 3. As illustrated in FIG. 3, the reset signal RST momentarily goes high at the beginning of a cycle of operation, causing the switch 40 to momentarily provide a low impedance between the inverting input and the output of the differential amplifier 32. Assuming for an example of operation that the offset voltage circuitry 42 provides 0 volts on the noninverting input of the differential amplifier 32 and disregarding capacitive coupling and offset voltage effects, the node 34 will transition to 0 volts. Next, with the switch 40 in a high impedance state, the sampling signal SMPL1 causes the sample-and-hold circuit S/H$_1$ to sample the voltage on the node 34 and pass that voltage to the output V1'. (Which, of course, would be 0V for the given conditions of the example.) Also during the first portion of the time slot designated t1 in FIG. 3, the clock signal P1 is held high, causing the first capacitor CI to be charged to the first reference voltage VREF. Subsequently, the clock signal P1 is taken low and, after a delay, the clock signal P2 is taken high, causing the switches 14 and 16 to couple the first capacitor CI between ground and the inverting input of the differential amplifier 32.

The configuration of the differential amplifier 32 is one in which the amplifier attempts to maintain a virtual ground at its inverting input. Thus, connecting the first capacitor CI to the inverting input of the differential amplifier 32 causes the charge on the capacitor CI to be discharged, the amount of that charge being equal to the capacitance of the first capacitor CI times the value of the first reference voltage VREF. But because the inverting input of the differential amplifier 32 is only a virtual ground rather than a true ground, an equal but opposite charge is caused to be added to the second capacitor CF. In accordance with the fundamental principle that the charge on a capacitor is equal to the capacitance times the voltage across the capacitor, a resulting charge in output voltage of the differential amplifier 32 is equal to the first reference voltage VREF multiplied by the ratio of the capacitance of the first capacitor CI to the capacitance of the second capacitor CF. For the preferred embodiment illustrated, this capacitance ratio is designed to be 1/64; therefore, the voltage on the node 34 will increase by an amount equal to 1/64th of the first reference voltage VREF. The voltage increase is illustrated in FIG. 3 as the first step above ground and is designated in FIG. 3 as time slot t2. In the preferred embodiment, the time slot t2 is approximately 3 microseconds. During the time slot t2 the sampling signal SMPL2 causes the sample-and-hold circuits S/H$_2$ to sample the voltage on the node 34. The output V2', then, will be a DC voltage having a value of 1/64th of the first reference voltage VREF.

After the clock signal P2 has gone low, but still during the time slot t2, the clock signal P1 again causes the switches 14 and 16 to be such that the now discharged first capacitor CI is again charged to the first reference voltage VREF. At the beginning of time slot t3, in the same manner as before, the charge on the first capacitor CI is transferred to the second capacitor CF, causing the node 34 to again increase in voltage by another 1/64th of the first reference voltage VREF. This process is repeated until n steps above the lowest voltage have been generated. For the illustrative embodiment, n is equal to 64. The reset signal RST goes high at the end of the n+1 time slot, causing the switch 40 to provide a low impedance across the second capacitor CF. The second capacitor CF is thereby discharged and the node 34 transitions to 0 V. The process of generating the stair-step voltage waveform is then repeated for the next cycle.

In accordance with the foregoing, it will be appreciated that the outputs V1' through V64' may be used as a set of DC reference voltages wherein the difference in voltage between any reference voltage and its neighbors is almost identical to that of any other reference voltage.

As illustrated in FIG. 3, it is not necessary that the duration of each step of the stair-step waveform be identical; it should be readily apparent, however, that the relative timing of the clock signal P1, the clock signal P2, and the reset signal RST can be adjusted to make each time slot identical if desired.

In certain applications it is advantageous that the overall difference between the highest step of the stair-step voltage waveform and the second voltage reference be almost precisely equal to the magnitude of the first reference voltage VREF. A procedure for calibrating that overall voltage difference is next described. First, an iterative procedure is used to adjust the offset voltage of the differential amplifier 32 to be close to zero. To begin that procedure, the switch 40 is momentarily caused to be in a low impedance state. With the switch 40 in a high impedance state, the offset voltage circuitry 42 next provides a DC bias on the node VOFFSET that is sufficiently negative to cause any positive offset on the node 34 to be adjusted to a voltage slightly more negative than ground. The node 34 is then sampled by the sample-and-hold circuit S/H$_L$ and the sampled voltage is compared to ground by the voltage comparator 44. The voltage comparator 44 is a conventional offset-reduced high precision comparator. When the inverting input of the voltage comparator 44 is more negative than ground, the signal OFFRESLT at the output of the voltage comparator 44 will be high. So long as the signal OFFRESLT is high, the control and timing circuitry 30 will cause the offset voltage circuitry 42 to iteratively increase the bias voltage on the node VOFFSET. After the node 34 becomes close to 0 volts (within a tolerated error band of plus or minus one-quarter LSB, for example), the voltage comparator 44 causes the signal OFFRESLT to go low. The control and timing circuitry 30 then causes the offset voltage circuitry 32 to maintain the voltage on VOFFSET which provides the desired offset bias voltage.

After the offset has been adjusted, the stair-step waveform on the node 34 is generated as previously described. The voltage on the top step is sampled by the sample-and-hold circuit S/H$_H$, and the sampled voltage is compared to VREF by the voltage comparator 46. If the voltage of the node 34 is less than that of the first reference voltage VREF, the signal GAINRESLT will be high; conversely, if the voltage of the node 34 is greater than that of the first reference voltage VREF, the signal GAINRESLT will be low. The control and timing circuitry 30 will cause the capacitance of the second capacitor CF to be iteratively adjusted until the signal GAINRESLT indicates that maximum precision has been obtained.

In applications such as a flash A/D converter, it is generally desirable that the lowest voltage step not be at the second reference voltage (ground in this case); instead, it may be desirable to shift the entire set of DC reference voltages upward by an amount equivalent to approximately one-half LSB. For this purpose, the bias voltage on the node VOFFSET is increased by approximately one-half LSB. (The gain of the differential amplifier with respect to the noninverting input is approximately 1+CI/CF, or approximately 1+1/64 for the illustrative embodiment.) Alternatively, it may be desirable to shift the entire set of DC reference voltages downward by approximately one-half LSB. For such purpose, the voltage on the node VOFFSET is reduced by approximately one-half LSB. It should be noted, though, that if the bias voltage on VOFFSET is charged, it may be necessary to readjust the step-to-step voltage differential by readjusting the value of the second capacitor CF.

Figure 4:
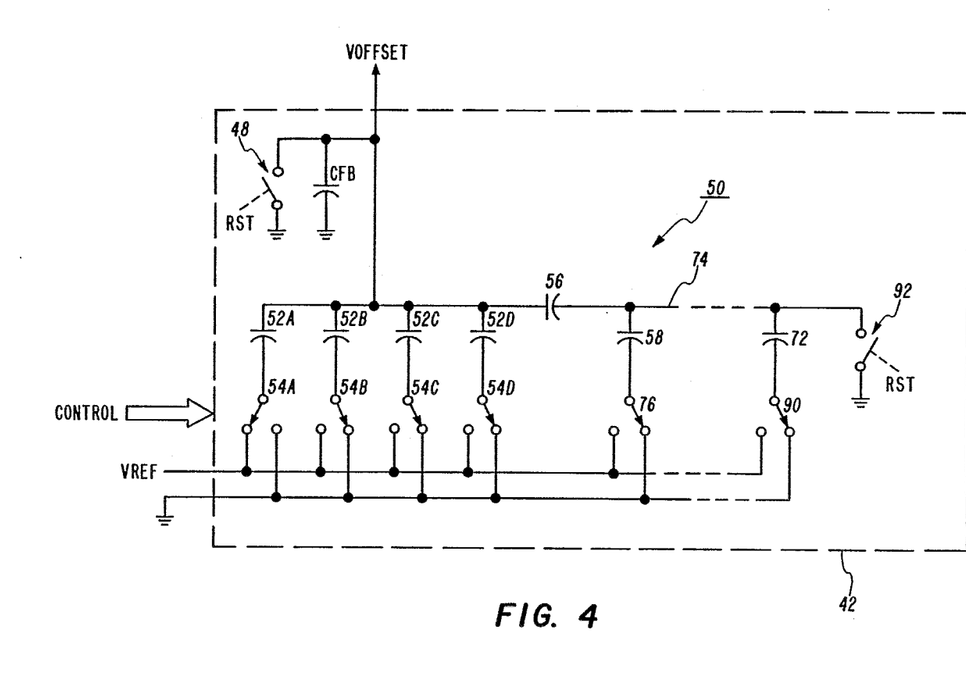
FIG. 4 is an electrical schematic diagram illustrating details of an embodiment of offset adjusting circuitry included in the reference voltage circuitry of FIG. 2.

Referring now to FIG. 4, details of an embodiment of the offset voltage circuitry 42 are illustrated. The offset voltage circuitry 42 includes a capacitor CFB connected between the node VOFFSET and ground, and a switch 48 connected in parallel with the capacitor CFB. For the purpose of optimizing common mode rejection characteristics of the reference voltage circuitry 12, the capacitor CFB is designed to have a capacitance approximately equal to that of the capacitor 36.

A capacitor array 50 is also coupled to the node VOFFSET. The capacitor array 50 includes a first set of capacitors comprising capacitors 52A, 52B, 52C, and 52D. in the preferred embodiment, the capacitances of these capacitors are approximately 0.89 pF, 0.48 pF, 0.25 pF, and 0.14 pF, respectively. Switches 54A through 54D allow one terminal of each of the capacitors 52A through 52D to selectively be coupled either to ground or to the first reference voltage VREF. The capacitor array 50 further includes a capacitor 56 which is connected in series between the node VOFFSET and a second set of fifteen capacitors 58 through 72. The capacitor 56 has a capacitance of approximately 0.17 pF. The capacitances of the capacitors 58 through 72 range in value from approximately 0.14 pF to 4.34 pF. Each of the capacitors 58 through 72 has a terminal connected to a node 74. The other terminal of each of the capacitors 58 through 72 can selectively be connected through fifteen switches 76 through 90 to either ground or the first reference voltage VREF. A switch 92 is coupled from the node 74 to ground and is controlled by the reset signal RST. Each of the switches included in the offset voltage circuitry 42 is controlled by the control and timing circuitry 30.

With the switches 54A through 54D and 76 through 90 positioned as illustrated in FIG. 4, all capacitors included in the offset voltage circuitry 42 are discharged to ground when the reset signal RST goes high with the exception of the capacitor 52A which is charged to the first reference voltage VREF. In order to initially cause the voltage on the node VOFFSET to go negative by an amount sufficient to overcome any positive offset voltage of the differential amplifier 32, the switch 54A is caused to switch from the first reference voltage VREF to ground. With the switch 48 in a high impedance condition, switching the capacitor 52A from VREF to ground causes a negative voltage to be coupled to the node VOFFSET. The voltage on VOFFSET can then be incrementally increased from such negative value by selectively switching the capacitors 54B through 54D from ground to the first reference voltage VREF. It is desirable that such voltage adjustment be capable of being made in fine increments. The smaller the capacitance that is switched, the smaller the effect on the voltage of VOFFSET. There is, however, a practical limit as to how small capacitors can be made in monolithic integrated circuits. To alleviate this difficulty, the capacitors 58 through 72 are made larger than otherwise would be desired, but the effect on VOFFSET of switching these capacitors is attenuated by connecting them to the node VOFFSET through the capacitor 56 rather than directly.

In the reference voltage circuitry 12 of FIG. 2, the variable capacitive element 38 is configured in the same manner as the capacitor array 50; different control signals from the control and timing circuitry 30, though, are utilized to selectively connect the switchable terminals of the capacitors therein either to ground or to the node 34. Additionally, it should be understood that the variable capacitive element 38 is not utilized to adjust any DC bias voltage; but, instead, it is utilized to adjust the capacitance of the second capacitor CF and, hence, the voltage difference between steps.

In an MOS monolithic integrated circuit, the bias voltage thus generated on the node VOFFSET will decay with time as the charge on the capacitor CFB leaks off due to PN junction leakage currents. It is therefore necessary to occasionally refresh the bias voltage on the node VOFFSET. A relatively fast method for refreshing the offset bias voltage is next described. After a full calibration and offset adjustment has been performed as described above, a memory included within the control and timing circuitry 30 digitally stores information as to the final connection of each of the switches 54A through 54D and of the switches 76 through 90. When it is desired to refresh the voltage on VOFFSET—which can be as often as once every stair-step waveform cycle—the reset signal RST is momentarily pulsed high while each of the switches 54A through 54D and each of the switches 76 through 90 is restored to its uncalibrated initial position, thereby establishing the same initial charge on each of those capacitors. After the reset signal RST is taken low, the control and timing circuitry 30, using its digital memory, reconnects all the capacitors of the offset voltage circuitry 42 to where they were in the calibrated state.

A preferred embodiment of the present invention has been described. It should be apparent to persons of ordinary skill in the art that various changes may be made in the method and circuitry described without departing from the spirit and scope of the invention. For example, in many applications it should be sufficient for biasing the noninverting input of the differential amplifier 32 to simply connect that input directly to ground (or to the second reference voltage if different from ground). And, of course, the number of steps of the stair-step waveform can be varied and the number of sample-and-hold circuits can be varied in accordance with the particular requirements of the electronic system in which the invention is utilized.

What is claimed is:

1. Apparatus for generating a stair-step voltage waveform on a signal output terminal, comprising:
   a. a first capacitor;
   b. a differential amplifier having its output coupled to said signal output terminal;
   c. control and timing circuit means for controlling the operation of said apparatus;
   d. means coupled to and responsive to outputs of said control and timing circuit means for switching one terminal of said first capacitor between a first reference voltage and a second reference voltage;
   e. means coupled to and responsive to outputs of said control and timing circuit means for switching the other terminal of said first capacitor between the inverting input of said differential amplifier and said second reference voltage;
   f. means for biasing the noninverting input of said differential amplifier;
   g. a second capacitor coupled between the inverting input and the output of said differential amplifier, said second capacitor being adjustable in capacitance value in response to at least one output of said control and timing circuit coupled to said second capacitor; and h. switching means connected in parallel with said second capacitor and coupled to and responsive to an output of said control and timing circuit means for selectively providing a low impedance between the inverting input and the output of said differential amplifier;

whereby a stair-step voltage waveform may be provided on said signal output terminal.

2. The apparatus of claim 1 wherein said means for biasing the noninverting input of said differential amplifier comprises a connection between said noninverting input and ground.

3. Apparatus for generating a set of DC reference voltages, comprising:
  a. a first capacitor;
  b. a differential amplifier;
  c. control and timing circuit means for controlling the operation of said apparatus;
  d. means coupled to and responsive to outputs of said control and timing circuit means for switching one terminal of said capacitor between a first reference voltage and a second reference voltage;
  e. means coupled to and responsive to outputs of said control and timing circuit means for switching the other terminal of said first capacitor between the inverting input of said differential amplifier and said second reference voltage;
  f. means for biasing the noninverting input of said differential amplifier;
  g. a second capacitor coupled between the inverting input and the output of said differential amplifier, said second capacitor being adjustable in capacitance value;
  h. switching means connected in parallel with said second capacitor and coupled to and responsive to an output of said control and timing circuit means for selectively providing a low impedance between the inverting input and the output of said differential amplifier; and
  i. a plurality of sample-and-hold circuits, the input of each said sample-and-hold circuit being coupled to the output of said differential amplifier, said sample-and-hold circuits being coupled to and responsive to outputs of said control and timing circuit means for sequentially sampling a stair-step signal at the output of said differential amplifier; whereby a set of reference voltages may be provided at the outputs of said plurality of sample-and-hold circuits.

4. Apparatus for generating a set of DC reference voltages, comprising:
  a. first capacitor;
  b. a differential amplifier;
  c. control and timing circuit means for controlling the operation of said apparatus;
  d. means coupled to and responsive to outputs of said control and timing circuit means for switching one terminal of said capacitor between a first reference voltage and a second reference voltage;
  e. means coupled to and responsive to outputs of said control and timing circuit means for switching the other terminal of said first capacitor between the inverting input of said differential amplifier and said second reference voltage;
  f. means for biasing the noninverting input of said differential amplifier, said means for biasing comprising a connection between said noninverting input and ground;
  g. a second capacitor coupled between the inverting input and the output of said differential amplifier, said second capacitor being adjustable in capacitance value;
  h. switching means connected in parallel with said second capacitor and responsive to an output of said control and timing circuit means for selectively providing a low impedance between the inverting input and the output of said differential amplifier; and
  i. a plurality of sample-and-hold circuits, the input of each said sample-and-hold circuit being coupled to the output of said differential amplifier, said sample-and-hold circuits being coupled to and responsive to outputs of said control and timing circuit means for sequentially sampling a stair-step signal at the output of said differential amplifier;

whereby a set of reference votlages may be provided at the outputs of said plurality of sample-and-hold circuits.

5. Apparatus for generating a stair-step voltage waveform on a signal output terminal, comprising:
  a. a first capacitor;
  b. a differential amplifier having its output coupled to said signal output terminal;
  c. control and timing circuit means for controlling the operation of said apparatus;
  d. means coupled to and responsive to outputs of said control and timing circuit means for switching one terminal of said first capacitor between a first reference voltage and a second reference voltage;
  e. means coupled to and responsive to outputs of said control and timing circuit means for switching the other terminal of said first capacitor between the inverting input of said differential amplifier and said second reference voltage;
  f. means for biasing the noninverting input of said differential amplifier, said means for biasing comprising:
    i. a second capacitor connected between the noninverting input of said differential amplifier and said second reference voltage;
    ii. switching means coupled to and responsive to an output of said control and timing circuit means for selectively providing a low impedance across the terminals of said second capacitor;
    iii. a variable capacitive element comprising a plurality of capacitors, each of said plurality of capacitors having one terminal connected to the noninverting input of said differential amplifier; and
    iv. switching means coupled to and responsive to outputs of said control and timing circuit means for selectively connecting the other terminal of each of said plurality of capacitors to either said first reference voltage or said second reference voltage;
  g. a third capacitor coupled between the inverting input and the output of said differential amplifier, said third capacitor being adjustable in capacitance value; and
  h. switching means connected in parallel with said third capacitor and coupled to and responsive to an output of said control and timing circuit means for selectively providing a low impedance between the inverting input and the output of said differential amplifier;

whereby a stair-step voltage waveform may be provided on said signal output terminal.

6. Apparatus for generating a set of DC reference voltages, comprising:
   a. a first capacitor;
   b. a differential amplifier;
   c. control and timing circuit means for controlling the operation of said apparatus;
   d. means coupled to and responsive to outputs of said control and timing circuit means for switching one terminal of said capacitor between a first reference voltage and a second reference voltage;
   e. means coupled to and responsive to outputs of said control and timing circuit means for switching the other terminal of said first capacitor between the inverting input of said differential amplifier and said second reference voltage;
   f. means for biasing the noninverting input of said differential amplifier, said means for biasing comprising:
      i. a second capacitor connected between the noninverting input of said differential amplifier and said second reference voltage;
      ii. switching means coupled to and responsive to an output of said control and timing circuit means for selectively providing a low impedance across the terminals of said second capacitor;
      iii. a variable capacitive element comprising a plurality of capacitors, each of said plurality of capacitors having one terminal connected to the noninverting input of said differential amplifier; and
      iv. switching means coupled to and responsive to outputs of said control and timing circuit means for selectively connecting the other terminal of each of said plurality of capacitors to either said first reference voltage or said second reference voltage;
   g. a third capacitor coupled between the inverting input and the output of said differential amplifier, said third capacitor being adjustable in capacitance value;
   h. switching means connected in parallel with said third capacitor and coupled to and responsive to an output of said control and timing circuit means for selectively providing a low impedance between the inverting input and the output of said differential amplifier; and
   i. a plurality of sample-and-hold circuits, the input of each said sample-and-hold circuit being coupled to the output of said differential amplifier, said sample-and-hold circuits being coupled to and responsive to outputs of said control and timing circuit means for sequentially sampling a stair-step signal at the output of said differential amplifier;

whereby a set of reference voltages may be provided at the outputs of said plurality of sample-and-hold circuits.

7. A method for generating a set of DC reference voltages, comprising:
   a. applying a low impedance across the terminals of a first capacitor for a duration sufficient to discharge any charge stored on said first capacitor;
   b. removing said low impedance from said first capacitor;
   c. charging a second capacitor to a first voltage;
   d. forming a charge transfer path between said first capacitor and said second capacitor and transferring substantially all of the charge on said second capacitor to said first capacitor;
   e. sampling the voltage that is provided across the terminals of said first capacitor with a selected one of a plurality of sample-and-hold circuits, said plurality of sample-and-hold circuits being coupled to said first capacitor; and
   f. repeating steps c, d, and e for a number of times that is one less than the number of sample-and-hold circuits, utilizing a different selected one of said plurality of sample-and-hold circuits for each such repetition;

whereby a set of DC reference voltages is provided at the outputs of said sample-and-hold circuits.

* * * * *